(12) United States Patent
Ware et al.

(10) Patent No.: US 8,824,224 B2
(45) Date of Patent: Sep. 2, 2014

(54) FREQUENCY-AGILE STROBE WINDOW GENERATION

(75) Inventors: Frederick A. Ware, Los Altos Hills, CA (US); Brian S. Leibowitz, San Francisco, CA (US); Ely Tsern, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 230 days.

(21) Appl. No.: 13/545,255

(22) Filed: Jul. 10, 2012

(65) Prior Publication Data

US 2013/0033946 A1    Feb. 7, 2013

Related U.S. Application Data

(60) Provisional application No. 61/515,513, filed on Aug. 5, 2011.

(51) Int. Cl.
*G11C 19/00*    (2006.01)
(52) U.S. Cl.
USPC .................. 365/193; 365/194; 365/233.1
(58) Field of Classification Search
USPC ....................... 365/193, 194, 233.1
See application file for complete search history.

(56) References Cited

U.S. PATENT DOCUMENTS 6,373,753 B1 *   4/2002   Proebsting .............. 365/189.09
2009/0307521 A1  12/2009  Lee et al.

* cited by examiner

*Primary Examiner* — Son Dinh
*Assistant Examiner* — Nam Nguyen
(74) *Attorney, Agent, or Firm* — The Neudeck Law Firm, LLC

(57) ABSTRACT

The disclosed embodiments relate to components of a memory system that support frequency-agile strobe enable window generation during read accesses. In specific embodiments, this memory system contains a memory controller which includes a timing circuit to synchronize a timing-enable signal with a timing signal returned from a read path, wherein the timing signal includes a delay from the read path. In some embodiments, the timing circuit further comprises two calibration loops. The first calibration loop tracks the timing-enable signal with respect to a cycle-dependent delay in the delay, wherein the cycle-dependent delay depends on a frequency of the strobe signal. The second calibration loop tracks the timing-enable signal with respect to a cycle-independent delay in the delay, wherein the cycle-independent delay does not depend on the frequency of the strobe signal. In some embodiments, the first calibration loop and the second calibration loop are cascaded.

50 Claims, 8 Drawing Sheets

MEMORY SYSTEM 100

FREQUENCY-AGILE STROBE WINDOW GENERATION

RELATED APPLICATION

This application hereby claims priority under 35 U.S.C. §119 to U.S. Provisional Application No. 61/515,513, entitled "Frequency-Agile Strobe Window Generation", by Frederick A. Ware, Brian S. Leibowitz and Ely Tsern filed 5 Aug. 2011.

TECHNICAL FIELD

The disclosed embodiments generally relate to the design of clocked memory systems. More specifically, the disclosed embodiments relate to a clocked memory system that generates a frequency-agile strobe window.

BACKGROUND

In clocked memory systems, data is transmitted along with an accompanying timing reference signal in both directions over a channel. This timing reference signal (or timing signal) can be a clock signal, a strobe signal, or another form of timing reference signal. For example, some memory systems utilize a timing reference signal to provide source synchronous clocking events for data signals associated with read and write accesses. Unfortunately, as the signaling rate increases, it becomes challenging to synchronize these signals properly.

In particular, the total communication path length through memory system components is often relatively long. For example, the read path includes circuitry for generating the read command in the clock domain of a memory controller, circuitry for transmitting this information between the memory controller and a memory device, circuitry for receiving the information at the memory device, circuitry for accessing the read data from the memory core, circuitry for transmitting the read data and a corresponding timing reference signal to the memory controller, and circuitry for receiving the read data using the timing reference signal at the memory controller. This communication path includes various delays that may change as operating conditions, such as temperature or a supply voltage, vary. By the time the read data and the associated timing reference signal are received at the memory controller, the phase relationship between the controller's clock domain and the returned timing reference signal may be uncertain.

DETAILED DESCRIPTION

The disclosed embodiments relate to components of a memory system that support read accesses in a memory system. In specific embodiments, this memory system contains a memory controller which communicates with a memory comprising one or more memory devices. This memory controller includes a timing circuit that synchronizes various signals during both read operations and write operations. The read operations are associated with a "read path" which carries various signals from the memory controller to the memory and then back to the memory controller. The delays through this read path can be significant. Hence, the signals that travel through the read path typically require multiple cycles of a timing signal associated with the read accesses to traverse the read path.

During a read operation, the timing circuit in the memory controller synchronizes a timing-enable signal with a timing signal returned from a read path, wherein the returned timing signal includes a multi-cycle delay from the read path. In some embodiments, the timing circuit includes two calibration loops. The first calibration loop tracks the timing-enable signal with respect to a first delay (e.g., a cycle-dependent delay in the multi-cycle delay which depends on a frequency of the timing signal). The second calibration loop tracks the timing-enable signal with respect to a second delay (e.g., a cycle-independent delay in the multi-cycle delay which does not depend on the frequency of the timing signal). For example, the first delay as a cycle-independent delay can include delay components such as: a clock-to-output delay of a register, a propagation delay of a signal within a device, an output multiplexer delay for a transmitter, a driver delay for a transmitter, a propagation delay of a signal between a transmitter on a first device and a receiver on a second device, a level-conversion delay in the receiver, an amplification delay in a receiver, and a data-to-clock-setup delay of a register.) In some embodiments, the first calibration loop and the second calibration loop are cascaded so that the timing circuit generates a timing-enable signal that tracks both the cycle-dependent delay and the cycle-independent delay.

Figure 1A:
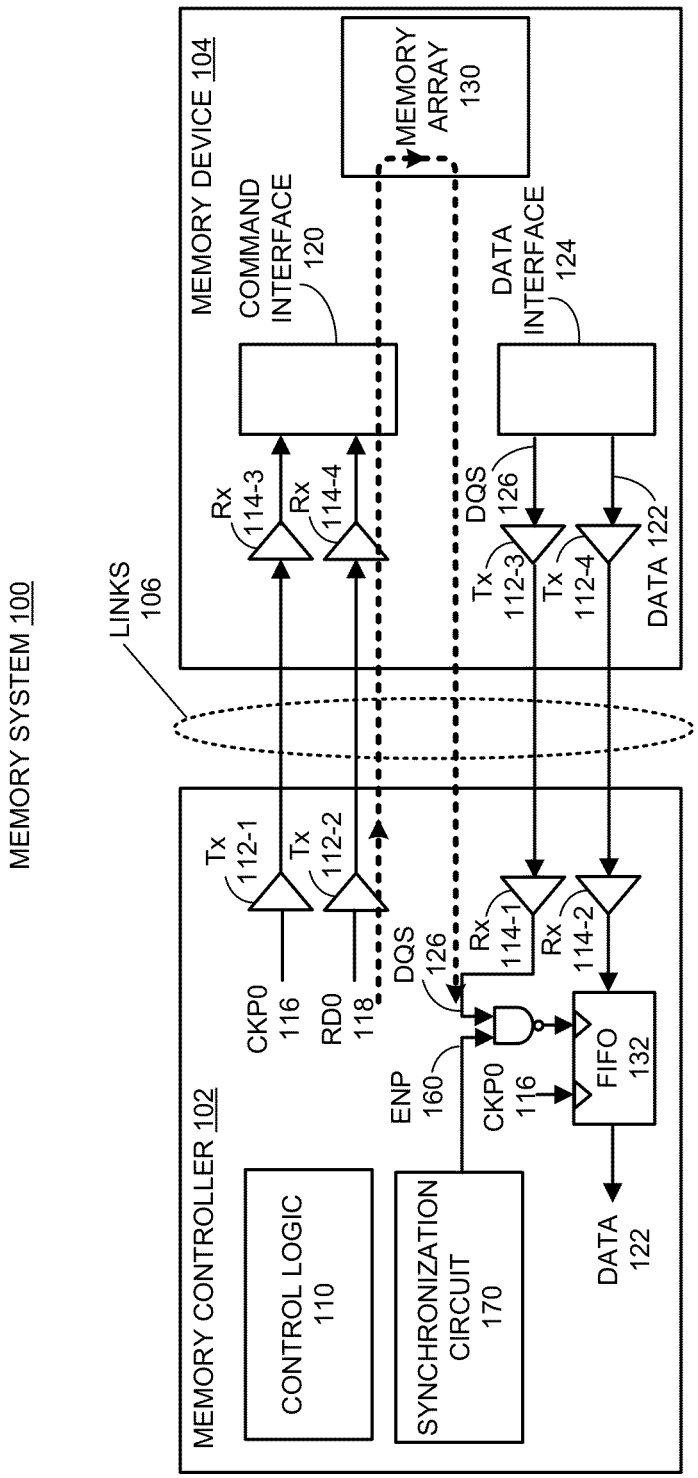
FIG. 1A presents a block diagram illustrating an embodiment of a memory system that supports source synchronous memory access.

FIG. 1A presents a block diagram illustrating an embodiment of a memory system 100 that supports memory accesses with source synchronous data transfers. As is illustrated in FIG. 1A, memory system 100 includes a memory controller 102 which is coupled to a memory device 104 through links 106. While FIG. 1A illustrates memory system 100 having one memory controller and one memory device, other embodiments may have additional controllers and additional memory devices. Links 106 may be used for bidirectional and/or unidirectional communications between memory controller 102 and memory device 104. Moreover, the bidirectional communication may be simultaneous. In some embodiments, one or more of links 106 and corresponding transmitting circuits (Tx) 112-1 to 112-4 and/or receiving circuits (Rx) 114-1 to 114-4 may be dynamically configured, for example, by control logic 110 in memory controller 102, to provide bidirectional and/or unidirectional communication.

Transmitting circuits (Tx) 112-1 and 112-2 in memory controller 102 transmit a clock signal (CKP0) 116 and a read command (RD0) 118 across links 106 to memory device 104. Within memory device 104, clock signal 116 and read command 118 are received using receiving circuits (Rx) 114-3 and 114-4, and then fed into command interface 120. This causes a corresponding read access to be performed in memory array 130, which produces read data 122. (The system can include one or more memory devices possibly arranged in one or more memory modules, wherein a given memory device can be a memory chip or integrated circuit, and a memory module is a substrate that includes a number of memory devices.) Next, read interface data 122 subsequently feeds through data interface 124, which generates a data strobe signal (DQS) 126 which is phase-aligned with read data 122.

Next, transmitting circuits 112-3 and 112-4 within memory device 104 transmit read data 122 and a corresponding strobe signal 126 across links 106 to memory controller 102. Then, receiving circuits 114-1 and 114-2 within memory controller 102 receive read data 122 and strobe signal 126. These signals then feed into first-in, first-out (FIFO) buffer 132, wherein read data 122 is recovered using both returned strobe signal 126 and original clock signal (CKP0) 116 in the clock domain of memory controller 102.

Although not illustrated in FIG. 1A, one or more buffers can exist between memory controller 102 and memory device 106. For example, there a CA register (to store command/address information) and/or a DQ buffer (to store data) can be disposed between memory controller 102 and memory device 104. In this case, the techniques described in this specification also apply to various paths between memory controller 102 and a buffer, between the buffer and memory device 104, or to a round-trip path from memory controller 102 through the buffer to memory device 104, and in the return direction (possibly through another buffer) back to memory controller 102.

Figure 1B:
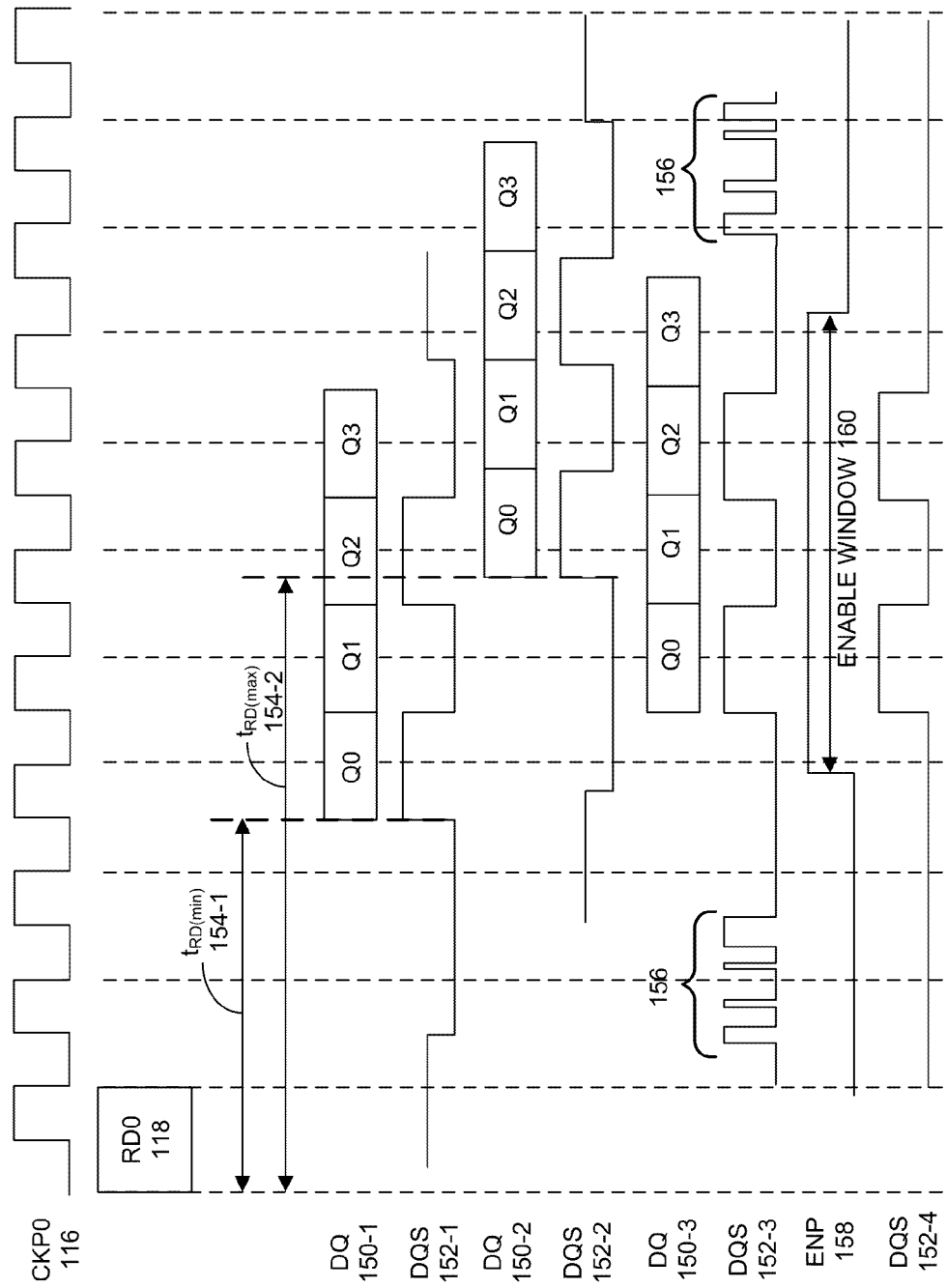
FIG. 1B presents a timing diagram for a read data signal and a corresponding data strobe signal.

Delays may occur at various locations along this read path, and these delays may vary due to changes in temperature and/or supply voltage. This is illustrated in FIG. 1B, which provides a timing diagram for an exemplary read data signal (DQ) 150 and a corresponding strobe signal (DQS) 152 returned during a read access. Note that each transition in DQS 152 is associated with a corresponding data bit in DQ 150. Also note that in this example, four data bits are transmitted with each burst of strobe transitions in DQS 152. In other embodiments, the number of data bits transmitted with each burst may be more than four (e.g., eight or sixteen) or less than four. As illustrated in this timing diagram, the round trip read path delay $t_{RD}$ can vary between a minimum value 154-1 and a maximum value 154-2. Moreover, the variation between 154-1 and 154-2 can be longer than 1 clock cycle of CKP0 116.

Note that returned strobe signal 152 may include spurious transitions between valid data strobes, wherein the spurious transitions do not correspond to valid read data. An exemplary strobe signal 152-3 comprising spurious transitions 156 is shown in FIG. 1B. These spurious transitions may be caused by noise along the read path and can potentially generate invalid read data within FIFO 132. To remediate this problem, in some embodiments, memory controller 102 also generates an enable signal (ENP) 158 which includes an enable window 160 corresponding to valid transitions in strobe signal 152-3. Enable signal 158 may be used to clean up or eliminate spurious transitions 156 to generate a clean strobe signal (DQS) 152-4, which may then be used to clock the returned read data 150-3.

To correctly gate each data strobe signal requires enable signal 158 to track the read path delay $t_{RD}$ associated with strobe signal 152-3. Note that this read path delay can vary by as much as several bit times due to voltage and temperature effects. In some embodiments, a synchronization circuit in the memory controller (e.g., synchronization circuit 170 in FIG. 1A) is provided to synchronize enable signal 158 with respect to strobe signal 152-3 to ensure that enable window 160 selects only those strobes corresponding to valid read data.

In some memory operations, it is desirable to adjust frequency of the clock signal (e.g., CKP0 116) on the memory controller very quickly, for example, on a cycle-to-cycle basis. However, matching the enable signal to the strobe signal returned from a read path in a system that supports two or more clock frequencies creates problems. Typically, read path delay $t_{RD}$ is calibrated in a single calibration loop at a constant clock frequency and the calibrated delay is expressed as a single value in units of time or clock cycles. However, the actual delay changes when the clock frequency varies during a multi-cycle read access. The instant application describes, in various embodiments, a delay calibration technique which can quickly adapt to such clock frequency changes and can track the delay variations caused by such changes.

Figure 2A:
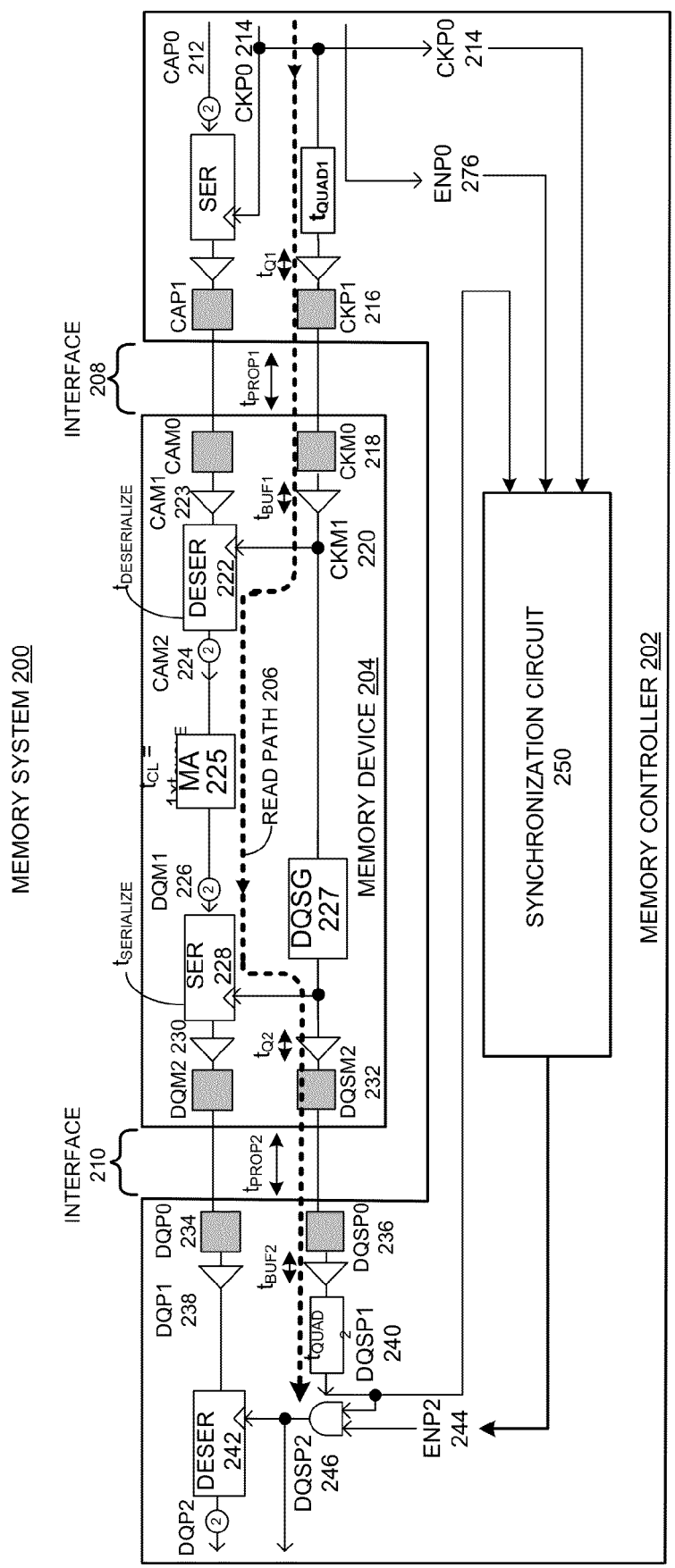
FIG. 2A presents a block diagram illustrating various memory system components and various delays associated with the read path in a memory system.

FIG. 2A presents a block diagram illustrating various memory system components and various delays associated with a read path 206 in a memory system 200, which includes a memory controller 202 and a memory device 204. FIG. 2A is associated with FIG. 2B, which provides a timing diagram for various timing reference signals associated with read path 206. Note that to better demonstrate the delay components in read path 206, memory controller 202 is illustrated "unfolded" and straddling memory device 204, and as a result, the round-trip read path 206 is also unfolded to form a unidirectional path going from right to left. Hence, the first interface 208 on the right between memory controller 202 and memory device 204 represents the forward links in read path 206 where signals are transmitted from memory controller 202 to memory device 204, and the second interface 210 on the left represents the return links in read path 206 where signals are transmitted from memory device 204 back to memory controller 202.

Figure 2B:
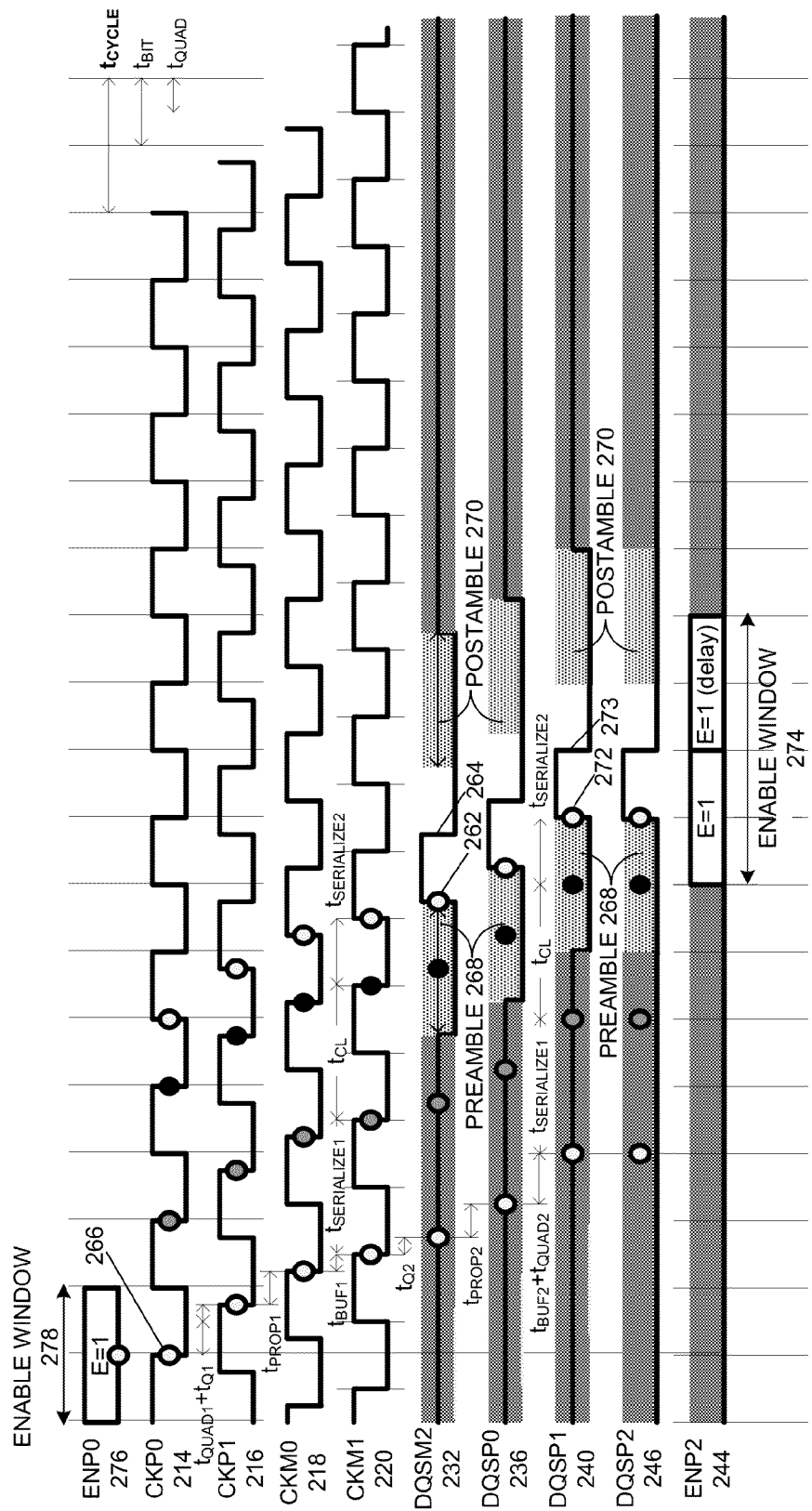
FIG. 2B presents a timing diagram for various timing reference signals associated with the read path illustrated in FIG. 2A.

More specifically, read path 206 starts in memory controller 202 on the right side in FIG. 2A, where a command/address signal CAP0 212 containing a read command and an accompanying clock CKP0 214 are generated. As CKP0 214 travels along read path 206 toward interface 208, CKP0 214 experiences a quadrature delay $t_{QUAD1}$ and a driver delay $t_{Q1}$ before reaching the output port of memory controller 202. (The quadrature delay, $t_{QUAD1}$, is related to a 90° phase offset which is introduced between the data and the strobe to facilitate sampling a data value with the strobe.) At this point, CKP0 214 becomes clock signal CKP1 216. The phase-relationship between CKP0 214 and CKP1 216 is shown in FIG. 2B. Note that FIG. 2B corresponds to a clocked memory scheme wherein a clock cycle or equivalent strobe cycle includes two bit times.

Referring back to FIG. 2A, after clock signal CKP1 216 is transmitted across interface 208 and experiences a first propagation delay $t_{PROP1}$, clock signal CKP1 216 is received at memory device 204 and is regenerated as clock signal CKM0 218. The phase-relationship between CKP1 216 and CKM0 218 is shown in FIG. 2B. CKM0 218 is subsequently delayed by a clock buffer with buffer delay $t_{BUF1}$ and is renamed as clock signal CKM1 220. The phase-relationship between CKM0 218 and CKM1 220 is shown in FIG. 2B. CKM1 220 is then used to clock a deserializer (DESER) 222 which deserializes command/address signals CAM1 223 received from memory controller 202 to produce parallel command/address signal CAM2 224. In doing so, CAM2 224 experiences a delay $t_{deserialize}$ associated with the deserializing operation with respect to CKM1 220 and CAM1 223. Note that delay $t_{deserialize}$ can include one or more clock cycles of CKP0 214 or CKM1 220, and we refer to one clock cycle time as $t_{CYCLE}$ of these clock signals. In this example, $t_{CYCLE}$ also equals two bit times $t_{BIT}$.

Next, CAM2 224 causes a read access to occur in a memory array (MA) 225 within memory device 204, which generates read data DQM1 226. Note that the length of this memory access "$t_{CL}$" can include one or more $t_{CYCLE}$. In the embodiment illustrated in FIGS. 2A and 2B, we assume that this read access is exactly one $t_{CYCLE}$ long, i.e., $t_{CL}=1\times t_{CYCLE}$. However, in other embodiments $t_{CL}$ can be a multiple of $t_{CYCLE}$. Note that the generated read data DQM1 226, which can contain 4, 8, 16, or another number of data bits, is now delayed by ($t_{deserialize}+t_{CL}$) with respect to CKM1 220. Next, read data DQM1 226 is serialized by a serializer (SER) 228 (which is clocked by the same clock CKM1 220 as deserializer 222) to produce serialized data signal DQM2 230. In doing so, DQM2 230 experiences a delay $t_{serialize}$ associated with the serializing operation with respect to DQM1 226. DQM2 230 is now delayed by a total of ($t_{deserialize}+t_{CL}+t_{serialize}$) with respect to CKM1 220. This cumulative delay becomes a portion of total delay associated with read path 206.

Note that a data strobe signal DQSM2 232 is generated in DQS generation circuitry (DQSG) 227 to provide a timing-reference for DQM2 230. (DQSG generates the DQSM2 232 waveform illustrated in FIG. 2B.) Because DQSM2 232 and DQM2 230 are phase-aligned, DQSM2 232 also includes the cumulative delay experienced by clock signal CKM1 220 with respect to original clock signal CKP0 214, and the cumulative delay ($t_{deserialize}+t_{CL}+t_{serialize}$) with respect to clock signal CKM1 220. Additionally, both DQM2 230 and DQSM2 232 experience a driver delay $t_{Q2}$ before reaching the output port of memory device 204.

The phase-relationship between original clock signal CKP0 214 and DQSM2 232 is shown in FIG. 2B. As illustrated in FIG. 2B, data strobe DQSM2 232 includes two edges (i.e., 262 and 264) corresponding to two read data bits in DQM2 230. However, in other embodiments, data strobe DQSM2 232 can include a different number of strobe edges accompanying a different number of data bits returned from the read access. Note that the cumulative timing offset between CKP0 214 and DQSM2 232 is the distance between the first falling edge 266 in CKP0 214 and the rising strobe edge 262 in DQSM2 232, which equals the combined delays of ($t_{QUAD1}+t_{Q1}+t_{PROP1}+t_{BUF1}+t_{deserialize}+t_{CL}+t_{serialize}+t_{Q2}$). Moreover, strobe edges 262 and 264 in DQSM2 232 are surrounded by $1\times t_{CYCLE}$ preamble 268 equal to zeros and $1\times t_{CYCLE}$ postamble 270 equal to zeros. The preamble and the postamble are inserted in the strobe signal to ensure that DQSM2 232 remains low before and after strobe edges 262 and 264. These noise-free regions provide margins for aligning the enable windows with the data strobes. Note that in other embodiments the lengths of preamble 268 and postamble 270 may be different from $1\times t_{CYCLE}$.

With further reference to FIG. 2A, after transmitting data signal DQM2 230 across interface 210 and experiencing the second propagation delay $t_{PROP2}$, data signal DQM2 230 is received at memory controller 202 as DQP0 234. Meanwhile, strobe signal DQSM2 232 is received at memory controller 202 and is regenerated as strobe signal DQSP0 236, wherein DQP0 234 and DQSP0 236 remain phase-aligned with each other. The phase-relationship between DQSM2 232 and DQSP0 236 is shown in FIG. 2B. DQP0 234 is subsequently delayed by another clock buffer (with buffer delay $t_{BUF2}$) and becomes data signal DQP1 238. Meanwhile, DQSP0 236 is delayed by both buffer delay $t_{BUF2}$ and a second quadrature delay $t_{QUAD2}$ and becomes strobe signal DQSP1 240. The phase-relationship between DQSP0 236 and DQSP1 240 is shown in FIG. 2B. As illustrated in FIG. 2B, the total timing offset between CKP0 214 in the clock domain of memory controller 202 and strobe signal DQSP1 240 is the distance between the first falling edge 266 in CKP0 214 and the rising strobe edge 272 in DQSP1 240, which equals the combined delays of ($t_{QUAD1}+t_{QUAD2}+t_{Q1}+t_{Q2}+t_{PROP1}+t_{PROP2}+t_{BUF1}+t_{BUF2}+t_{deserialize}+t_{CL}+t_{serialize}$).

As discussed previously, before strobe signal DQSP1 240 is used to clock in DQP1 238 at deserializer (DESER) 242, memory controller 202 generates an enable signal ENP2 244 containing an enable window 274 that gates strobe edges 272 and 273 in DQSP1 240. This gating operation on DQSP1 240 generates a clean strobe signal DQSP2 246, which is subsequently used to clock in data DQP1 238. (This strobe gating operation can be implemented in different ways. For example, the system can allow unqualified strobes into the deserializer, and can subsequently gate the output of the deserializer before the FIFO. However, the same issue of needing to calibrate both cycle-dependent and time-dependent delays exists for these other embodiments.) As illustrated in FIG. 2B, when there is no timing offset between DQSP1 240 and DQSP2 246, the noise outside of the enable window 274 in DQSP1 240 is removed to produce DQSP2 246. In the embodiment illustrated in FIG. 2B, ENP2 244 is synchronized with DQSP1 240 by straddling enable window 274 across edges 272 and 273. In this way, strobe edges 272 and 273 are guarded by preamble 268 and postamble 270. Hence, synchronizing ENP2 244 with DQSP1 240 involves aligning the rising edge of enable window 274 with the center of preamble 268 and the falling edge of enable window 274 with the center of postamble 270.

In one embodiment, ENP2 244 can be derived from an enable signal ENP0 276 containing an enable window 278 which is created at the beginning of read path 206. As illustrated in FIG. 2B, ENP0 276 is generated such that the center of enable window 278 is initially aligned with clock edge 266 in CKP0 214, which corresponds to the beginning of read path 206. To derive ENP2 244 from ENP0 276, a synchronization circuit 250 is provided in memory controller 202. As illustrated in FIG. 2A, synchronization circuit 250 receives inputs of ENP0 276, CKP0 214, and DQSP1 240, and generates ENP2 244 as output. In one embodiment, synchronization circuit 250 includes calibration logic for tracking the timing offset between CKP0 214 and DQSP1 240, which equals the cumulative read path delay $t_{TOTAL}=(t_{QUAD1}+t_{QUAD2}+t_{Q1}+t_{Q2}+t_{PROP1}+t_{PROP2}+t_{BUF1}+t_{BUF2}+t_{deserialize}+t_{CL}+t_{serialize})$ as discussed above. Synchronization circuit 250 can then generate ENP2 244 by delaying ENP0 276 with respect to CKP0 214 by the calibrated $t_{TOTAL}$. A detailed embodiment which calibrates $t_{TOTAL}$ using synchronization circuit 250 is now described.

In one embodiment, read path delay $t_{TOTAL}$ can be separated into three components. The first component, referred to as "$t_C$", includes cumulative delays $t_{deserialize}+t_{CL}+t_{serialize}$. Note that each term in $t_C$ includes an integer multiple of $t_{CYCLE}$ (or integer multiples of some fixed fraction of $t_{CYCLE}$.)

Hence, $t_C$ also includes an integer number of clock cycles times. Note that if the clock frequency changes during a multi-cycle read delay, clock cycle time $t_{CYCLE}$ also varies, but the number of clock cycles in $t_C$ does not change. We refer to the delay component $t_C$ as a "cycle-dependent read path delay," or simply "cycle-dependent delay."

The second component, referred to as "$t_D$", includes cumulative delays $t_{Q1}+t_{Q2}+t_{PROP1}+t_{PROP2}+t_{BUF1}+t_{BUF2}$. Note that $t_D$ is comprised of buffer delays, driver delays, and propagation delays, which are typically independent of the length of $t_{CYCLE}$, but can vary due to changes in temperature and/or supply voltage. If the clock frequency changes during a multi-cycle read delay, none of the delay terms in $t_D$ will change with clock frequency. We refer to the delay component $t_D$ as a "cycle-independent read path delay" or simply "cycle-independent delay." Cycle-independent delay $t_D$ can generally be longer or shorter than $1 \times t_{CYCLE}$ and can include a fraction of one $t_{CYCLE}$. For example, $t_D$ can equal $1 \times t_{CYCLE}$ plus a fraction of one $t_{CYCLE}$.

Note that the cycle-independent delay components are not limited to the components $t_{Q1}$, $t_{Q2}$, $t_{PROP1}$, $t_{PROP2}$, $t_{BUF1}$, and $t_{BUF2}$ illustrated in FIG. 2A. Generally, the components of the cycle-independent delay $t_D$ can include, but are not limited to, clock-to-output delay of a register, propagation delay of a signal within a device, output multiplexer (Omux) delay of a transmitter, driver delay of a transmitter, propagation delay of a signal between a transmitter on one device and a receiver on another device, level-conversion delay and amplification delay in a receiver, and data-to-clock-setup delay of a register. In the above list, a "device" can refer to a memory controller or a memory device. Note that all of the above listed delays may vary due to changes in temperature and/or supply voltage.

Finally, the third component in $t_{TOTAL}$, referred to as "$t_Q$", includes both the transmit and receive quadrature delays $t_{QUAD1}$ and $t_{QUAD2}$. Note that each quadrature delay is half $t_{BIT}$ long or $0.25 \times t_{CYCLE}$, and hence $t_Q$ equals $1 \times t_{BIT}$ or $0.5 \times t_{CYCLE}$. This relationship does not change when $t_{CYCLE}$ changes during the course of a multi-cycle read delay.

Figure 3A:
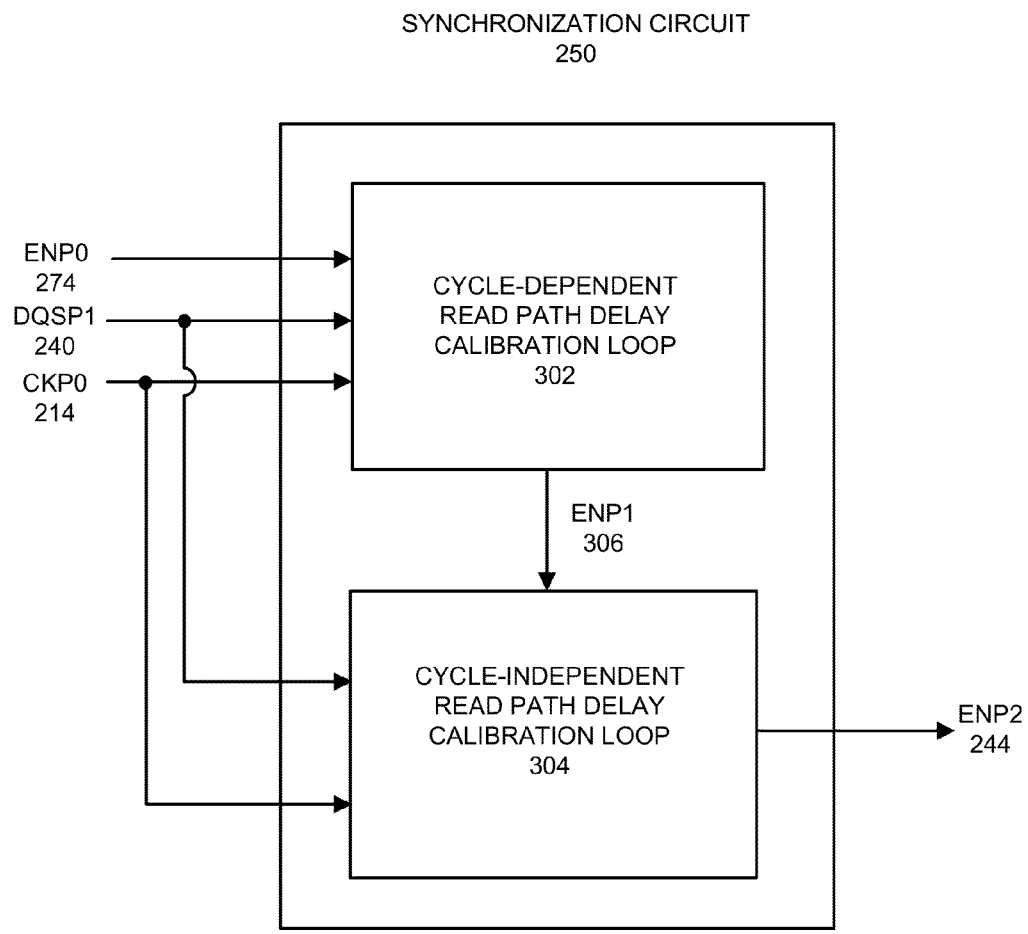
FIG. 3A presents a block diagram illustrating an embodiment of a synchronization circuit which includes two cascaded calibration loops for calibrating the read path delay and generating an enable signal for enabling the returned timing reference signal.

FIG. 3A presents a block diagram illustrating an embodiment of synchronization circuit 250 which includes two cascaded calibration loops for calibrating the read path delay $t_{TOTAL}$ and generating enable signal ENP2 244 for gating strobe signal DQSP1 240. As is illustrated in FIG. 3A, synchronization circuit 250 includes a "cycle-dependent read path delay calibration loop" 302 for calibrating cycle-dependent delay $t_C$, and a "cycle-independent read path delay calibration loop" 304 for calibrating cycle-independent delay $t_D$. Moreover, the two calibration loops are cascaded such that calibration loop 304 receives the calibrated cycle-dependent delay $t_C$ from calibration loop 302, which is to be combined with calibrated cycle-independent delay $t_D$.

More specifically, calibration loop 302 receives the original clock signal CKP0 214, initial enable signal ENP0 276 (which is phase-aligned with CKP0 214), and returned strobe signal DQSP1 240 (i.e., the feedback signal) as inputs, and generates a delayed enable signal ENP1 306 as an output. In one embodiment, calibration loop 302 is used to track cycle-dependent delay $t_C$. Ideally, ENP1 306 is time-delayed with respect to ENP0 276 by an amount substantially equal to cycle-dependent delay $t_C$. In one embodiment, cycle-dependent delay $t_C$ is measured in the unit of $t_{CYCLE}$ in calibration loop 302.

Like calibration loop 302, calibration loop 304 receives the original clock signal CKP0 214 and strobe signal DQSP1 240 (i.e., the feedback signal) as inputs. Calibration loop 304 also receives the delay enable signal ENP1 306 from calibration loop 302 as an input, which is further delayed within calibration loop 304. Calibration loop 304 generates enable signal ENP2 244 as its output, which is subsequently used to gate strobe signal DQSP1 240. In one embodiment, calibration loop 304 is used to track cycle-independent delay $t_D$. In some embodiments, cycle-independent delay $t_D$ is measured in units of time (e.g., picoseconds) in calibration loop 304.

Note that because quadrature delay $t_Q$ is deterministic, a separate calibration loop may not be needed to track $t_Q$. In one embodiment, calibration loop 304 can include fixed delay components that mimic $t_{QUAD1}$ and $t_{QUAD2}$ to take into account quadrature delay $t_Q$. Moreover, $t_Q$ may be measured in terms of time units or cycle units, and may or may not change when the duration of $t_{CYCLE}$ changes. In one embodiment, it remains a constant time value equal to $0.25 \times t_{CYCLE, MIN}$ (corresponding to the fastest possible clock), and is not accurately in quadrature for slower clocks. In another embodiment, it is adjusted in absolute time so that it remains equal to $0.25 \times t_{CYCLE}$ even as the clock period changes. Also, in the above-described embodiments, calibration loop 302 and calibration loop 304 are configured to independently track cycle-dependent delay $t_C$ and cycle-independent delay $t_D$, instead of tracking the full read path delay $t_{TOTAL}$ using a single calibration loop. These separate calibrations allow the two delay components $t_C$ and $t_D$ to be measured in different units as described above. We now describe each calibration loop in more detail.

Figure 3B:
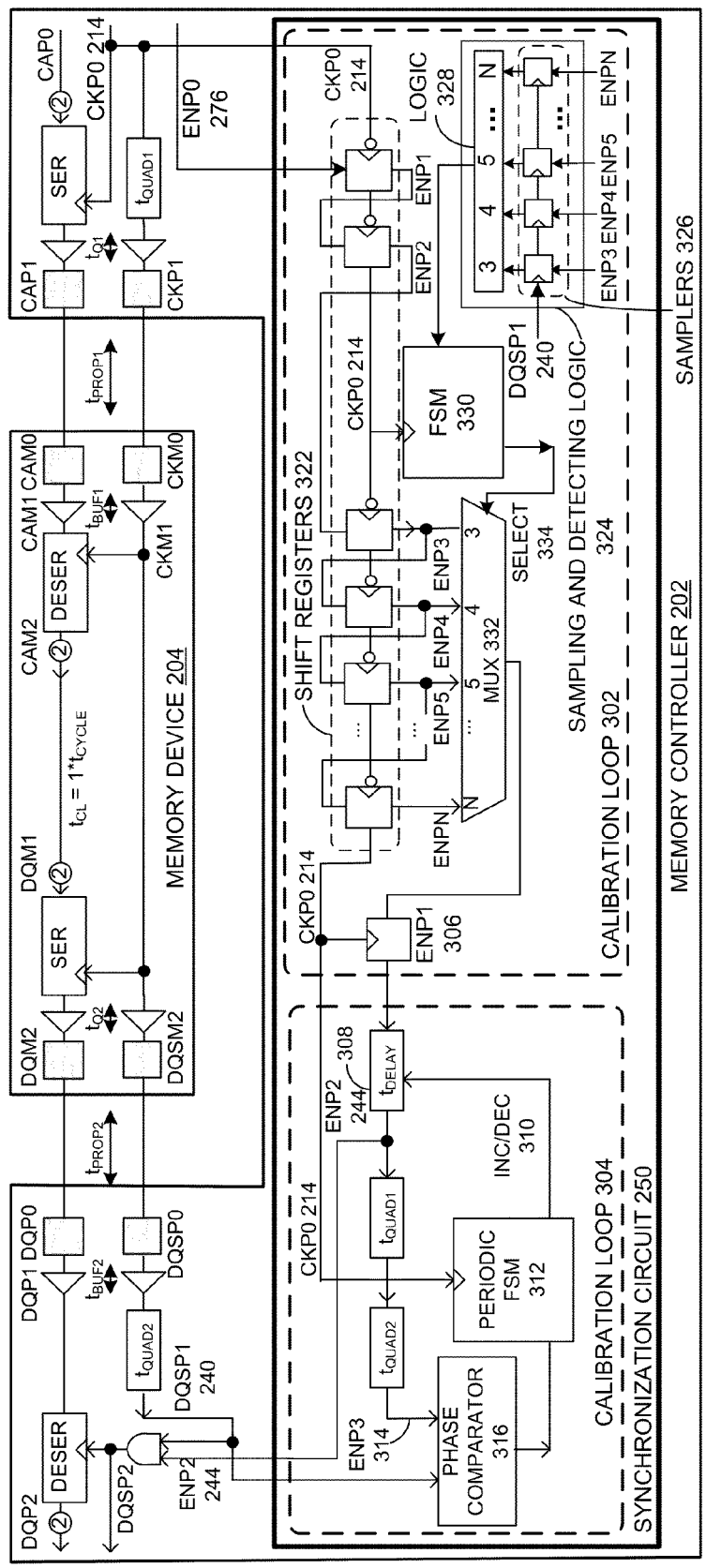
FIG. 3B presents a block diagram illustrating a detailed embodiment of the synchronization circuit which includes two cascaded calibration loops.

FIG. 3B presents a block diagram illustrating a detailed embodiment of synchronization circuit 250 which includes cascaded calibration loops 302 and 304. Note that synchronization circuit 250 is described in the context of memory system 200 in FIG. 2A.

In the embodiment of FIG. 3B, while cycle-dependent delay $t_C$ and cycle-independent delay $t_D$ are calibrated independently using separate calibration loops, cycle-dependent delay $t_C$ may be calibrated before cycle-independent delay $t_D$ is calibrated. This is because the cascaded delays in synchronization circuit 250 require that cycle-dependent delay $t_D$ be correctly factored into ENP1 306 so that calibration loop 304 only needs to track the remaining portions of read path delay $t_{TOTAL}$. We now describe a detailed embodiment of calibration loop 302.

We begin by introducing a minimum value for $t_{CYCLE}$ for calibrating $t_D$, referred to as $t_{CYCLE, MIN}$. In one embodiment, $t_{CYCLE, MIN}$ equals the cycle-independent delay $t_D = t_{CYCLE, MIN} = (t_{Q1}+t_{Q2}+t_{PROP1}+t_{PROP2}+t_{BUF1}+t_{BUF2})$. In one embodiment, calibrating $t_D$ using calibration loop 304 is performed when $t_{CYCLE}$ is set to substantially equal to $t_{CYCLE, MIN}$. (In other embodiments, the calibration can take place at any future cycle rate.)

We additionally introduce a maximum value of $t_{CYCLE}$ used to calibrate $t_C$ in calibration loop 304, referred to as $t_{CYCLE, MAX}$. $t_{CYCLE, MAX}$ may be set to equal to multiple of $t_{CYCLE, MIN}$ described above, e.g., $4 \times t_{CYCLE, MIN}$ or $8 \times t_{CYCLE, MIN}$. In one embodiment, the minimum value to be used as $t_{CYCLE, MAX}$ should be greater than $(t_D+t_Q)=(t_{Q1}+t_{Q2}+t_{PROP1}+t_{PROP2}+t_{BUF1}+t_{BUF2}+t_{QUAD1}+t_{QUAD2})$. In general, $t_{CYCLE, MAX}$ can be set to a sufficiently large value so that cycle-independent delay $t_D$ is much less than $1 \times t_{CYCLE, MAX}$.

Once $t_{CYCLE, MAX}$ is selected, a calibration process, such as the one using calibration loop 302 in FIG. 3B may be performed to calibrate cycle-dependent delay $t_C$ while clock cycle CKP0 214 is set to $t_{CYCLE, MAX}$. In one embodiment, calibration loop 302 includes logic to determine an integer number of clock cycles $t_{CYCLE, MAX}$ within read path delay $t_{TOTAL}$. Note that because cycle-independent delay $t_D \ll t_{CYCLE, MAX}$, the technique ensures that calibration loop 302 measures exclusively cycle-dependent delay $t_C$, because $t_D+t_Q$ only appears as a fraction of a full cycle $t_{CYCLE, MAX}$. In some embodiments, the cycle delay is pre-defined (or otherwise known from system design variables) such that the cycle delay can be directly programmed, while $t_D$ still needs to be calibrated.

Figure 3C:
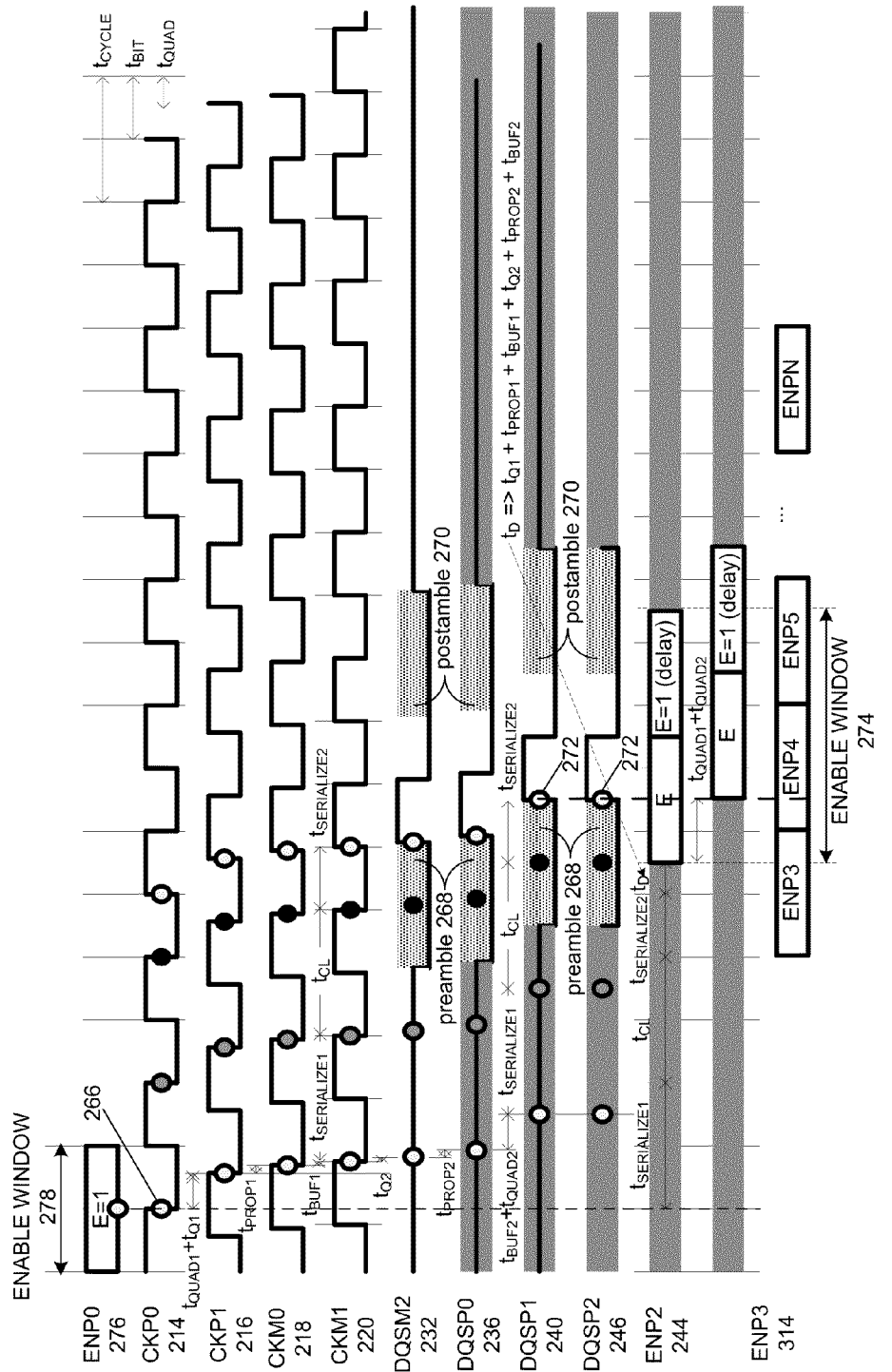
FIG. 3C presents a timing diagram for various timing reference signals when calibrating the cycle-dependent delay using calibration loop 302 in FIG. 3B.

One embodiment of $t_C$ calibration is illustrated in FIG. 3B and a corresponding timing diagram of various timing reference signals is provided in FIG. 3C. Note that signals which are common between FIGS. 2A and 3B are labeled with the same reference numerals. For example, initial enable signal ENP0 276, original clock signal CKP0 214, returned strobe signal DQSP1 240 are all signals common in both FIG. 2A and FIG. 3B. As illustrated in FIG. 3C, ENP0 276 and CKP0 214 are initially phase-aligned such that the center of enable window 278 is aligned with clock edge 266 in CKP0 214. In this embodiment, $t_{CYCLE}=t_{CYCLE, MAX}=4 \times t_{CYCLE, MIN}$ is used. This value satisfies the timing constraint $t_{CYCLE} > t_D+t_Q$. Moreover, $t_{QUAD1}=t_{QUAD1}=0.25 \times t_{CYCLE}$ is also satisfied. As a result, $t_D$ is shown in FIG. 3C to be much shorter than $t_{CYCLE}=t_{CYCLE, MAX}$.

Referring back to FIG. 3B, note that calibration loop 302 includes a set of shift registers 322 coupled in series. More specifically, shift registers 322 receive initial enable signal ENP0 276 as input and CKP0 214 as clock to each of the shift registers. As ENP0 276 shifts down from right to left, shift registers 322 output a sequence of delayed enable signals ENP1, ENP2, ENP3, ..., ENPN, wherein N represents a delay measured in the number of clock cycles between a delayed enable signal ENPN and the initial enable signal ENP0 276. For example, ENP3 is delayed by $3 \times t_{CYCLE}$ with respect to ENP0 276, ENP4 is delayed by $4 \times t_{CYCLE}$ with respect to ENP0 276, and so on.

With further reference to FIG. 3B, calibration loop 302 also includes sampling and detecting logic 324 for determining the number of $t_{CYCLE}$ in the delayed strobe signal DQSP1 240. More specifically, sampling and detecting logic 324 includes a series of samplers 326 wherein each sampler receives one of the delayed enable signals ENP3, ENP4, ENP5, ..., ENPN as input, respectively. In one embodiment, input signals to samplers 326 are sampled in parallel by the same delayed strobe signal DQSP1 240 which includes the read path delay $t_{TOTAL}$. This sampling operation is illustrated in FIG. 3C to detect which delayed enable window (ENP3, ENP4, ENP5, ..., ENPN) is sampled by the rising strobe edge 272 of DQSP1 240. In the exemplary timing diagram of FIG. 3C, strobe edge 272 falls within and samples ENP4. Hence, when the rising edge 272 of DQSP1 240 is used to sample the series of delayed signals ENP3, ENP4, ENP5, ..., ENPN, only the output of the sampler associated with ENP4 outputs a one, while other samplers in the series of samplers 326 output zero.

Referring back to FIG. 3B, note that sampling and detecting logic 324 also includes a detection logic 328 coupled to the outputs of samplers 326. Upon receiving the sampled outputs from samplers 326, detection logic 328 translates these values into the correct number of cycles for representing the cycle-dependent delay $t_C$. In the example of FIG. 3B, detecting logic 328 and hence sampling and detecting logic 324 generate an output "4."

Note that the embodiment of FIG. 3B does not include samplers for delayed signals ENP1 and ENP2. This is based on an assumption that the cycle-dependent delay $t_C=t_{deserialize}+t_{CL}+t_{serialize}$ is at least 2 cycles long, and therefore the output is guaranteed to be greater than 2. However, other embodiments can include samplers for one or both ENP1 and ENP2.

In some embodiments, calibration loop 302 is only activated occasionally, which is controlled by a finite state machine (FSM) 330 which is coupled between a multiplexer (MUX) 332 and sampling and detecting logic 324. In one embodiment, calibration loop 302 is activated during memory system initialization. As illustrated in FIG. 3B, once activated, FSM 330 can output an updated select signal 334 which equals the most recent output of sampling and detecting logic 324. Select signal 334 selects a corresponding delayed enable signal ENPN from MUX 332, for example, ENP4 in the example of FIG. 3C. The output from MUX 332 subsequently resets the cycle-dependent delay (i.e., $t_C=t_{deserialize}+t_{CL}+t_{serialize}$) in the output signal ENP1 306 of calibration loop 302. Note that calibration loop 302 can determine the correct delay for ENP1 306 based on the feedback signal DQSP1 240 in a single iteration. Once the delay in ENP1 306 is set up, FSM 330 can be deactivated, and the value of ENP1 306 is frozen until the next time a new calibration is needed to reset ENP1 306.

Because calibration loop 302 determines $t_C$ in terms of number of cycles instead of a delay time, during normal operation, the output of calibration loop 302 remains accurate even if the clock frequency might have changed during the read access. This is because $t_C$ includes only those delays that are cycle dependent, not frequency or cycle period dependent. Hence, once ENP1 306 has been set up after initialization, the memory system can continue to operate without updating ENP1 306, even if the clock frequency changes on a cycle-to-cycle basis. Also note that the value of cycle-dependent delay $t_C$ does not change with temperature, voltage, or other operating conditions.

Note that, in addition to memory system initialization, other conditions can trigger calibration loop 302 to recalibrate cycle-dependent delay $t_C$. For example, if read access delay $t_{CL}$ is expected to change as a result of an uncalibrated type of read access, calibration loop 302 may be activated by FSM 330 to recalibrate the cycle-dependent delay $t_C$. Generally, if any of the delay terms in $t_C$ (i.e., $t_{deserialize}$, $t_{CL}$, or $t_{serialize}$) are expected to change, the cycle-dependent delay $t_C$ may be recalibrated.

Also note that an implementation of calibration loop 302 is not limited to the specific embodiment illustrated in FIG. 3B. Other types of calibration circuits that can determine cycle-dependent delay $t_C$ in number of cycles and generate an enable signal delayed by $t_C$ can be used in place of calibration loop 302 illustrated in FIG. 3B.

While in many cases the cycle-dependent delay $t_C$ calibrated in number of $t_{CYCLE}$ does not change when the frequency changes, in some cases the memory controller can change the value representing the number of cycles in the cycle-dependent delay $t_C$ when the frequency changes. Such cases typically require the coordination between the memory controller and the memory device.

Referring back to FIG. 3B, once ENP1 306 is calibrated and the cycle-dependent delay $t_C$ is set, the cycle-independent delay $t_D$ can be calibrated next using calibration loop 304. In one embodiment, the cycle-independent delay $t_D$ is calibrated when $t_{CYCLE}$ is set to $t_{CYCLE, MIN}$. Initially, $t_{CYCLE, MIN}$ can be set using nominal values for each of the terms of $t_{Q1}$, $t_{Q2}$, $t_{PROP1}$, $t_{PROP2}$, $t_{BUF1}$, $t_{BUF2}$. Because each of these terms can vary due to changes in temperature and supply voltages, the calibrated $t_D$ can be longer or shorter than $1 \times t_{CYCLE, MIN}$. In some embodiments, $t_D$ is measured in time units (ps) rather than in cycle units.

As illustrated in FIG. 3B, calibration loop 304 includes an adjustable delay element 308, which delays enable signal ENP1 306 received from calibration loop 302 by a delay of "$t_{DELAY}$," and produces a delayed enable signal ENP2 244. Because ENP1 306 includes a calibrated cycle-dependent delay $t_C$, if $t_{DELAY}$ equals the cycle-independent delay $t_D$, ENP2 244 includes a total delay ($t_C+t_D$). As was described in conjunction with FIG. 2B, combined delay ($t_C+t_D$) in ENP2 244 causes the beginning of enable window 274 to align with the middle of preamble 268 in DQSP1 240, which is the desired position of ENP2 244. Hence, calibration loop 304 is configured to track cycle-independent delay $t_D$ using $t_{DELAY}$.

Figure 3D:
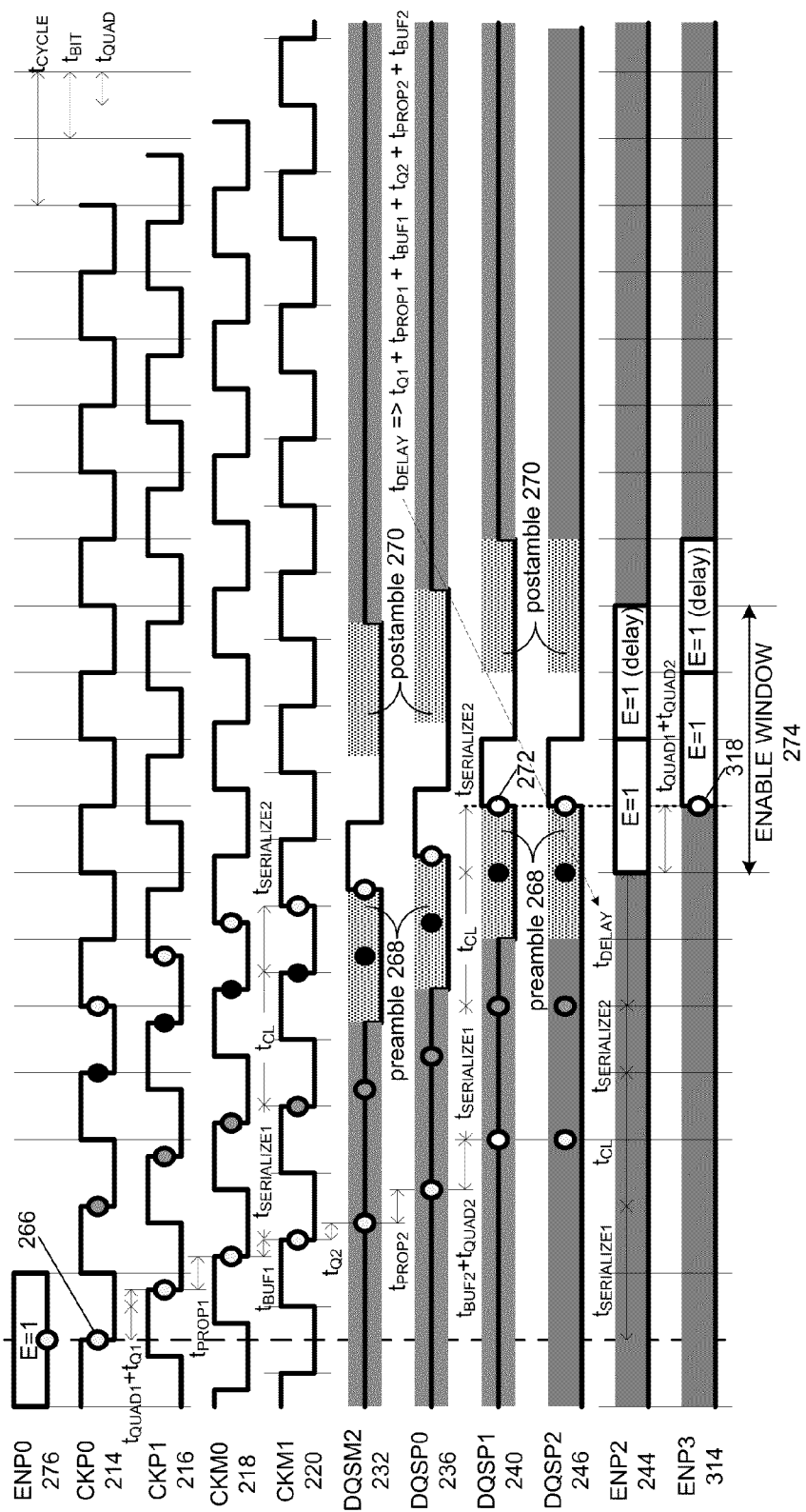
FIG. 3D presents a timing diagram for various timing reference signals when calibrating the cycle-independent delay using calibration loop 304 in FIG. 3B.

An exemplary system that calibrates $t_{DELAY}$ to track $t_D$ is illustrated in FIG. 3B, and a corresponding timing diagram of various timing reference signals is provided in FIG. 3D. Note that after being delayed by adjustable delay element 308, ENP2 244 is further delayed by two quadrature delay elements which assert delay $t_Q$. This produces a delayed enable signal ENP3 314 with a total delay of ($t_C+t_{DELAY}+t_Q$) relative to falling edge 266 in CKP0 214. Next, the phase of ENP3 314 is compared with DQSP1 240 by a phase-comparator 316, which subsequently generates an early-late decision based on the comparison. In the embodiment illustrated in FIG. 3D, phase-comparator 316 in FIG. 3B compares rising edge 272 in DQSP1 240 with the beginning (i.e., rising edge 318) of enable window 274 of ENP3 314. Because rising edge 272 in DQSP1 240 is delayed by $t_{TOTAL}=(t_C+t_D+t_Q)$ relative to falling edge 266 in CKP0 214, phase-comparator 316 essentially computes the relative delay ($t_D-t_{DELAY}$) between the two corresponding rising (or falling) edges in signals ENP3 314 and DQSP1 240. In one embodiment, phase-comparator 316 uses an XOR logic to produce an early/late decision between the two signals. The early/late decision is then used to generate an increment/decrement command (INC/DEC 310) through periodic FSM 312, which is used to update $t_{DELAY}$ which reduces the offset ($t_D-t_{DELAY}$). Note that calibration loop 304 can be engaged periodically, which is controlled by periodic FSM 312 between phase-comparator 316 and adjustable delay element 308.

Also note that an implementation of calibration loop 304 is not limited to the specific embodiment illustrated in FIG. 3B. In general, any type of calibration circuit that can perform a phase-alignment operation between signals ENP2 244 and DQSP1 240 to set $t_{DELAY}$ to $t_D$ can be used in place of calibration loop 304 illustrated in FIG. 3B.

After the cycle-independent delay $t_D$ is calibrated, calibration of read path delay $t_{TOTAL}$ is complete, and normal memory operation can begin. It should be noted that during normal operation, cycle-independent delay $t_D$ may change with temperature or supply voltages over time. Hence, $t_{DELAY}$ may be recalibrated periodically under the control of periodic FSM 312. Because $t_{DELAY}$ is calibrated in units of time, and terms that affect $t_{DELAY}$ are cycle-independent, the value of $t_{DELAY}$ is not affected by a clock frequency change. As a result, the combined delay calibrated by synchronization circuit 250 is immune to changes in clock frequency. Consequently, using two cascaded calibration loops described above to separately calibrate the cycle-dependent delay $t_C$ and the cycle-independent delay $t_D$ facilitates generating an enable signal which tracks the full read path delay $t_{TOTAL}$ quickly and adaptively even when the clock frequency changes on a cycle-to-cycle basis. Also, periodic calibration of $t_{DELAY}$ could continue at any clock frequency, facilitating continuous tracking of VT drift when different clock speeds are used.

Moreover, the general technique for splitting a calibrated delay path into a cycle-based portion and a fixed-delay-based portion can generally be applied to other delay paths and is not limited to the specific case of a delay path for the read enable window.

The above-described embodiments are applicable to memory controllers with interfaces that facilitate controlling different types of memory devices, for example, memory devices adhering to double data rate (DDR) standards, such as DDR2, DDR3, DDR4, GDDR5, XDR, Mobile XDR, LPDDR, and LPDDR2. However, these embodiments may differ in a number of respects, such as in the structure of the interface logic, the number of bank groups, and the number of memory banks within each bank group in a given memory device.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in, but are not limited to, application-specific integrated circuit (ASIC) chips, field-programmable gate arrays (FPGAs), and other programmable-logic devices.

What is claimed is:

1. An integrated circuit, comprising:
a timing circuit to synchronize a timing-enable signal with a timing signal returned from a read path on a memory device, wherein the timing signal includes a delay caused by the read path,
wherein the timing circuit comprises:
a first programmable adjustment circuit to track the timing-enable signal with respect to a first delay in the delay, wherein the first delay depends on a frequency of the timing signal; and
a second calibration circuit to track the timing-enable signal with respect to a second delay in the delay; and
wherein the timing-enable signal provides an enable window for the timing signal to receive read data returned through the read path.

2. The integrated circuit of claim 1,
wherein the first delay is a cycle-dependent delay; and
wherein the second delay is a cycle-independent delay.

3. The integrated circuit of claim 2, wherein the cycle-dependent delay is associated with a cycle-dependent portion of the read path.

4. The integrated circuit of claim 3, wherein the cycle-dependent delay includes a delay associated with a serializer for serializing the read data or control/command/address (CA) information associated with the read access.

5. The integrated circuit of claim 3, wherein the cycle-dependent delay includes a value representing a number of cycles in the delay caused by the cycle-dependent portion of the read path.

6. The integrated circuit of claim 5, wherein the value representing the number of cycles does not change with the period of the timing signal.

7. The integrated circuit of claim 5, wherein the value representing the number of cycles changes with the period of the timing signal.

8. The integrated circuit of claim 5, wherein the first programmable adjustment circuit includes a first calibration loop to determine the number of cycles in the cycle-dependent delay.

9. The integrated circuit of claim 8, wherein the first calibration loop operates to determine the number of cycles in the cycle-dependent delay by using a value of the clock reference cycle time from the allowable cycle time range such that the cycle-independent delay is less than one cycle time of the clock reference.

10. The integrated circuit of claim 9, wherein the maximum value of the clock reference cycle time is used from the allowable cycle time range.

11. The integrated circuit of claim 9, wherein the first calibration loop includes circuitry for sampling a series of delayed versions of the timing-enable signal with respect to the timing signal, wherein the series of delayed versions of the timing-enable signal are separated by one cycle time of the clock reference.

12. The integrated circuit of claim 8, wherein the first calibration loop initially determines the number of cycles in the cycle-dependent delay prior to performing a series of read accesses.

13. The integrated circuit of claim 1, wherein the period of the timing signal is variable.

14. The integrated circuit of claim 2, wherein the cycle-independent delay is associated with a cycle-independent portion of the read path.

15. The integrated circuit of claim 1, wherein the timing signal is a strobe signal.

16. The integrated circuit of claim 1, wherein the timing signal is a clock signal.

17. The integrated circuit of claim 2, wherein the second programmable adjustment circuit is to track the cycle-independent delay which includes:
a clock-to-output delay of a register element in the read path;
an output multiplexer delay of a transmitter element in the read path; and
a driver delay of a transmitter element in the read path.

18. The integrated circuit of claim 2, wherein the second programmable adjustment circuit includes a second calibration loop to calibrate the cycle-independent delay.

19. The integrated circuit of claim 18, wherein the second calibration loop calibrates the cycle-independent delay at a clock reference such that the cycle-independent delay is substantially equal to one cycle time of the clock reference.

20. The integrated circuit of claim 17, wherein the second calibration loop calibrates the cycle-independent delay by matching the cycle-independent delay in the timing signal with an adjustable delay associated with an adjustable delay element using a phase-alignment circuitry.

21. The integrated circuit of claim 20, wherein the second calibration loop receives a previously generated calibrated cycle-dependent delay, and generates the timing-enable signal which is delayed by the calibrated cycle-dependent delay and the calibrated cycle-independent delay.

22. The integrated circuit of claim 20, wherein the second calibration loop adjusts the cycle-independent delay using a minimum cycle time value of the cycle time range when a value for the cycle time ranges becomes comparable to or greater than the cycle time.

23. The integrated circuit of claim 22, wherein the second calibration loop adjusts the cycle-independent delay by using a value of the clock reference cycle time from the allowable cycle time range such that the cycle-independent delay is greater than one cycle time of the clock reference.

24. The integrated circuit of claim 21, wherein the minimum value of the clock reference cycle time is used from the allowable cycle time range.

25. The integrated circuit of claim 23, wherein the one or more phase-shift delays include a quadrature delay which is equal to one-half of a bit interval.

26. The integrated circuit of claim 23, wherein the second calibration loop uses the phase-alignment circuitry to phase-align the third timing-enable signal with respect to the timing signal by calibrating the adjustable delay.

27. The integrated circuit of claim 18, wherein the second calibration loop periodically recalibrates the cycle-independent delay.

28. The integrated circuit of claim 2, wherein the first programmable adjustment circuit and the second programmable adjustment circuit are coupled serially such that the second programmable adjustment circuit receives a calibrated value of the cycle-dependent delay as an input, which is subsequently combined with a calibrated value of the cycle-independent delay to produce the timing-enable signal.

29. A method for operating a memory controller, comprising:
receiving a timing signal returned from a read path on a memory device, wherein the timing signal includes a delay caused by the read path;
calibrating a timing-enable signal based on the timing signal by:
synchronizing the timing-enable signal with respect to a first delay in the delay, wherein the first delay depends on a frequency of the timing signal; and
synchronizing the timing-enable signal with respect to a second delay in the delay;
using the calibrated timing-enable signal to enable the timing signal; and
receiving read data returned through the read path using the enabled timing signal.

30. The method of claim 29,
wherein the first delay is a cycle-dependent delay; and
wherein the second delay is a cycle-independent delay.

31. The method of claim 30, wherein the cycle-dependent delay is associated with a cycle-dependent portion of the read path.

32. The method of claim 31, wherein the cycle-dependent delay includes:
a delay associated with a serializer for serializing the read data or control/command/address (CA) information associated with the read access;
a delay associated with a deserializer for deserializing the read data or the CA information; and
a delay associated with a read operation for retrieving the read data from a memory component.

33. The method of claim 31, wherein the cycle-dependent delay includes a value representing a number of cycles in the delay caused by the cycle-dependent portion of the read path.

34. The method of claim 33, wherein the value representing the number of cycles does not change with the period of the timing signal.

35. The method of claim 33, wherein the value representing the number of cycles changes with the period of the timing signal.

36. The method of claim 33, wherein synchronizing the timing-enable signal with respect to the cycle-dependent delay involves determining the number of cycles in the cycle-dependent delay.

37. The method of claim 33, wherein the method further comprises determining the number of cycles in the cycle-dependent delay at a clock reference such that a maximum cycle time range for the cycle-independent delay is less than one cycle time of the clock reference.

38. The method of claim 37, wherein determining the number of cycles involves sampling a series of delayed versions of the timing-enable signal with respect to the timing signal, wherein the series of delayed versions of the timing-enable signal are separated by one cycle time of the clock reference.

39. The method of claim 36, wherein the method further comprises initially determining the number of cycles in the cycle-dependent delay prior to performing a series of read accesses.

40. The method of claim 29, wherein the period of the timing signal can change on a cycle-to-cycle basis.

41. The method of claim 29, wherein the cycle-independent delay is associated with a cycle-independent portion of the read path.

42. The method of claim 41, wherein tracking the cycle-independent delay includes tracking one or more of the following components:
- a clock-to-output delay of a register element in the read path;
- a propagation delay of a signal within a device in the read path;
- an output multiplexer delay of a transmitter element in the read path;
- a driver delay of a transmitter element in the read path;
- a propagation delay of a signal between a transmitter element on one device in the read path and a receiver element on another device in the read path;
- a level conversion delay and amplification delay in a receiver element in the read path; and
- a data-to-clock-setup delay of a register element in the read path.

43. The method of claim 30, wherein synchronizing the timing-enable signal with respect to the cycle-independent delay involves calibrating the cycle-independent delay in a unit of time.

44. The method of claim 43, wherein the method further comprises calibrating the cycle-independent delay at a clock reference such that the cycle-independent delay is substantially equal to one cycle time of the clock reference.

45. The method of claim 43, wherein calibrating the cycle-independent delay involves matching the cycle-independent delay in the timing signal with an adjustable delay using a phase detection circuit.

46. The method of claim 45, wherein the method further comprises:
  receiving a previously generated calibrated cycle-dependent delay; and
  generating the calibrated timing-enable signal which is delayed by the calibrated cycle-dependent delay and the calibrated cycle-independent delay.

47. The method of claim 45, wherein calibrating the cycle-independent delay involves using a minimum cycle time value of the cycle time range when a value for the cycle time ranges becomes comparable to or greater than the cycle time.

48. The method of claim 43, wherein the method further comprises periodically recalibrating the cycle-independent delay.

49. A memory controller, comprising:
  a timing circuit to synchronize a timing-enable signal with a timing signal associated with a read access, wherein the timing signal includes a delay,
  wherein the timing circuit further comprises:
    a first programmable adjustment circuit to track the timing-enable signal with respect to a first delay in the delay, wherein the first delay depends on a frequency of the timing signal; and
    a second programmable adjustment circuit to track the timing-enable signal with respect to a second delay in the delay; and
  wherein the timing-enable signal provides an enable window for the timing signal to retime read data associated with the read access.

50. A method for operating a memory controller, comprising:
  receiving a timing signal associated with a read access, wherein the timing signal includes a delay;
  calibrating a timing-enable signal based on the timing signal by:
    synchronizing the timing-enable signal with respect to a first delay in the delay, wherein the first delay depends on a frequency of the timing signal; and
    synchronizing the timing-enable signal with respect to a second delay in the delay;
  using the calibrated timing-enable signal to enable the timing signal; and
  receiving read data associated with the read access using the enabled timing signal.

* * * * *